(12) United States Patent
Koo et al.

(10) Patent No.: US 11,810,806 B2
(45) Date of Patent: Nov. 7, 2023

(54) TRAY MODULE, TRAY ASSEMBLY INCLUDING THE SAME, AND METHOD FOR MANUFACTURING DISPLAY DEVICE USING THE SAME

(71) Applicant: Samsung Display Co., Ltd., Yongin-si (KR)

(72) Inventors: Jahuem Koo, Seoul (KR); Sungjin Joo, Asan-si (KR); Nampyo Hong, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 897 days.

(21) Appl. No.: 16/526,188

(22) Filed: Jul. 30, 2019

(65) Prior Publication Data
US 2020/0043768 A1    Feb. 6, 2020

(30) Foreign Application Priority Data
Aug. 1, 2018    (KR) .......................... 10-2018-0089794

(51) Int. Cl.
*H01L 21/67*    (2006.01)
*H01L 21/673*    (2006.01)
(Continued)

(52) U.S. Cl.
CPC ...... *H01L 21/67396* (2013.01); *B65G 49/064* (2013.01); *G02F 1/1303* (2013.01);
(Continued)

(58) Field of Classification Search
CPC ......... H01L 21/67396; H01L 21/67346; H01L 21/67363; B65G 49/064; B65G 2201/022;
(Continued)

(56) References Cited

U.S. PATENT DOCUMENTS 6,186,344 B1 *  2/2001  Park ................... H01L 21/6734
                                               211/41.18
6,380,998 B1 *  4/2002  Arai .................. G02F 1/133615
                                                    349/59

(Continued)

FOREIGN PATENT DOCUMENTS

CN    101112921 A     1/2008
CN    201082809 Y     7/2008
(Continued)

OTHER PUBLICATIONS

Chinese Office action dated Mar. 28, 2022, in corresponding Chinese Patent Application No. 201910101167.3 (10 pages).
(Continued)

*Primary Examiner* — Mohammed Shamsuzzaman
(74) *Attorney, Agent, or Firm* — Lewis Roca Rothgerber Christie LLP (57) ABSTRACT

A tray module capable of discharging static electricity to safely transfer display device members (e.g., components) includes: a tray configured to accommodate at least two members of a display device, at least two conductive protection films alternatingly stacked with the members of the display device, and a conductive pattern on the tray to provide a discharge path with the conductive protection films to ground.

11 Claims, 11 Drawing Sheets

(51) Int. Cl.
*G02F 1/13* (2006.01)
*B65G 49/06* (2006.01)

(52) U.S. Cl.
CPC .. *H01L 21/67346* (2013.01); *H01L 21/67363* (2013.01); *B65G 2201/022* (2013.01)

(58) Field of Classification Search
CPC ............. G02F 1/1303; G02F 1/133314; G02F 2202/22; G02F 1/133308; B65D 19/38; B65D 85/00; B65D 2519/00034; B65D 2519/00293; B65D 2519/00955; B65D 85/48; G09F 9/30; H05F 3/02
See application file for complete search history.

(56) References Cited

U.S. PATENT DOCUMENTS

| | | | | |
|---|---|---|---|---|
| 8,777,007 | B2* | 7/2014 | Chen | B65D 81/054 |
| | | | | 206/454 |
| 2005/0155904 | A1* | 7/2005 | Chen | B65D 85/48 |
| | | | | 206/719 |
| 2007/0095703 | A1* | 5/2007 | Kao | B65D 85/48 |
| | | | | 206/454 |
| 2009/0038987 | A1* | 2/2009 | Hyobu | H01L 21/67346 |
| | | | | 206/509 |
| 2011/0081747 | A1* | 4/2011 | Yoshitomi | H01L 29/78603 |
| | | | | 257/E21.328 |
| 2020/0301063 | A1* | 9/2020 | Cho | A47G 19/00 |
| 2022/0097946 | A1* | 3/2022 | Kim | B32B 27/365 |

FOREIGN PATENT DOCUMENTS

| | | |
|---|---|---|
| CN | 201128567 | 10/2008 |
| CN | 103466165 A | 12/2013 |
| CN | 103552334 A | 2/2014 |
| CN | 206032051 U | 3/2017 |
| CN | 206395074 U | 8/2017 |
| JP | 2001334598 A | 12/2001 |
| KR | 10-0188137 B1 | 6/1999 |
| KR | 10-2010-0019591 A | 2/2010 |
| KR | 10-2016-0031178 A | 3/2016 |
| KR | 10-2017-0049861 A | 5/2017 |
| KR | 10-1773639 B1 | 8/2017 |
| KR | 10-1830243 B1 | 2/2018 |
| TW | 200716459 A | 5/2007 |

OTHER PUBLICATIONS

Chinese Office action for Application No. 201910701167.3, dated Oct. 8, 2022, 11 pages.

* cited by examiner

TRAY MODULE, TRAY ASSEMBLY INCLUDING THE SAME, AND METHOD FOR MANUFACTURING DISPLAY DEVICE USING THE SAME

CROSS-REFERENCE TO RELATED APPLICATION

This application claims priority to and the benefit of Korean Patent Application No. 10-2018-0089794, filed on Aug. 1, 2018, the entire content of which is incorporated herein by reference.

BACKGROUND

One or more aspects of example embodiments of the present disclosure are related to a tray module for transferring display device members (e.g., components), a tray assembly including the same, and a method for manufacturing a display device using the same.

A display device may include a display panel, a protection member, an optical member, and/or the like. A display device may further include a touch screen to gather input. A transmissive or semi-transmissive display device may further include a backlight unit. The above-described display device members may be integrated with each other during lamination and assembly to produce the display device.

The display panel, the protection member, the optical member, the touch screen, and the backlight unit may each be manufactured in a different manufacturing line and subsequently assembled in one assembly line (e.g., the same assembly line). For example, one or more of the display panel, the protection member, the optical member, the touch screen, and the backlight unit may be produced and provided by an external company.

When display device members are transferred from their manufacturing line or transported from an external company to the assembly line, a tray assembly may be utilized to safely transfer those display device members.

SUMMARY

One or more aspects of example embodiments of the present disclosure are directed toward a tray module capable of discharging static electricity.

One or more aspects of example embodiments of the present disclosure are directed toward a tray assembly capable of discharging static electricity.

One or more aspects of example embodiments of the present disclosure are directed toward a method for manufacturing a display device using the tray assembly.

One or more example embodiments of the present disclosure provide a tray module including: a tray to accommodate at least two members of a display device; at least two conductive protection films to be alternatingly stacked with the at least two members of the display device; and a conductive pattern on the tray to provide or form a discharge path with the at least two conductive protection films.

In some embodiments, each of the conductive protection films may include: a synthetic resin layer; and a conductive layer on at least one of the top and bottom surfaces of the synthetic resin layer.

In some embodiments, the conductive layer may include a conductive polymer.

In some embodiments, each of the conductive protection films may include: a protection portion in contact with and overlapping a corresponding member of the at least two members of the display device; and a connecting portion in contact with the conductive pattern and extending from the protection portion.

In some embodiments, the tray may include: a bottom portion supporting the at least two members of the display device; and a sidewall portion extending from the bottom portion.

In some embodiments, a first portion of the conductive pattern may be on a top surface of the sidewall portion, a second portion of the conductive pattern may be on an outer surface of the sidewall portion, the conductive pattern may include a metal layer on the sidewall portion, and the conductive pattern may include a conductive tape on the sidewall portion.

In some embodiments, the tray module may further include a conductive layer on an inner surface of the tray, and the tray may include (be formed of) a synthetic resin.

In some embodiments, the tray module may further include a conductive pin to provide a discharge path between the conductive protection films.

In some embodiments, the tray module may further include a conductive connecting pattern to connect an uppermost conductive protection film of the conductive protection films to the conductive pattern.

One or more example embodiments of the present disclosure provide a tray assembly including n tray modules stacked with each other (where n is a natural number equal to or greater than two); and a support plate to support the n tray modules.

In some embodiments, the conductive patterns of the n tray modules may be electrically connected to each other.

In some embodiments, the conductive pattern of an i-th tray module of the n tray modules may contact the conductive pattern of at least one of an (i+1)-th tray module and an (i−1)-th tray module (where i is a natural number equal to or greater than one).

In some embodiments, the tray assembly may further include a discharge pattern on the support plate and connected to the conductive pattern of a lowermost tray module of the n tray modules.

One or more example embodiments of the present disclosure provide a method for manufacturing a display device including: providing first members of the display device; providing second members of the display device; and assembling one of the first members of the display device with one of the second members of the display device. Here, the providing of the first members of the display device includes transferring the first members of the display device using a tray assembly.

In some embodiments, each of the first members of the display device may include a glass light guide plate.

In some embodiments, each of the first members of the display device may further include a quantum dot layer on a surface of the glass light guide plate.

In some embodiments, each of the first members of the display device may include a display panel.

BRIEF DESCRIPTION OF THE DRAWINGS

The accompanying drawings are included to provide a further understanding of the present disclosure, and are incorporated in and constitute a part of this specification. The drawings illustrate example embodiments of the present disclosure and, together with the description, serve to explain principles of the present disclosure.

In the drawings.

DETAILED DESCRIPTION

The present disclosure will be described more fully hereinafter with reference to the accompanying drawings, in which example embodiments of the disclosure are shown. As those skilled in the art would realize, the described embodiments may be modified in various ways without departing from the spirit and scope of the present disclosure. Like reference numerals refer to like elements throughout, and duplicative descriptions thereof may not be provided. Also, in the drawings, the sizes, thicknesses, ratio, and dimensions of elements or components may be exaggerated for clarity of illustration. It will be understood that when an element or component such as a layer, film, region, or substrate is referred to as being "on" another component, it can be directly on the other element or component, or intervening element(s) or component(s) may also be present. In contrast, when an element or component is referred to as being "directly on" another element or component, no intervening elements or components are present.

The term "and/or" includes any and all combinations of one or more of the associated listed items. Expressions such as "at least one of", "one of", "selected from", "at least one selected from", and "one selected from", when preceding a list of elements, modify the entire list of elements and do not modify the individual elements of the list. Further, the use of "may" when describing embodiments of the present disclosure refers to "one or more embodiments of the present disclosure."

It will be understood that although terms such as "first" and "second" are used herein to describe various elements or components, the elements or components are not limited by these terms. Such terms are only used to distinguish one element or component from other elements or components. For example, a first element referred to as a first element in one embodiment can be referred to as a second element in another embodiment without departing from the scope of the appended claims. The terms of a singular form may include plural forms unless referred to the contrary.

The terms "under", "below", "above", "upper", and the like are used for explaining spatial relationships between components illustrated in the drawings. It will be understood that such spatially relative terms are intended to encompass different orientations of the device, as relevant to use or operation, in addition to the orientations depicted in the drawings.

The terms "include" or "comprise" refer to the existence or inclusion of one or more named properties, fixed numbers, steps, operations, elements, components, or combinations thereof, but do not exclude other (additional) properties, numbers, steps, operations, elements, components, and combinations thereof.

Figure 1:
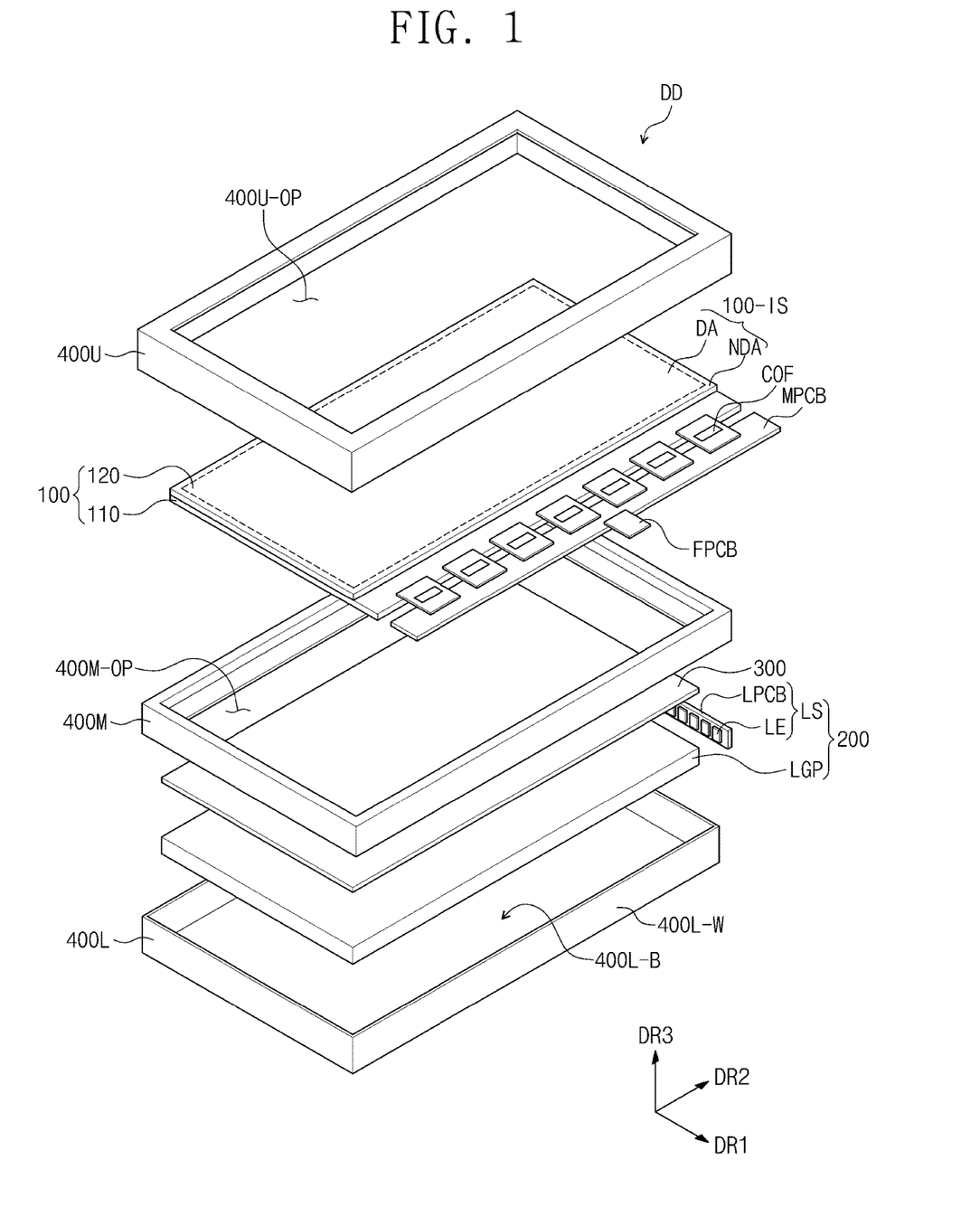
FIG. 1 is an exploded perspective view illustrating a display device according to an embodiment of the present disclosure.
Figure 2:
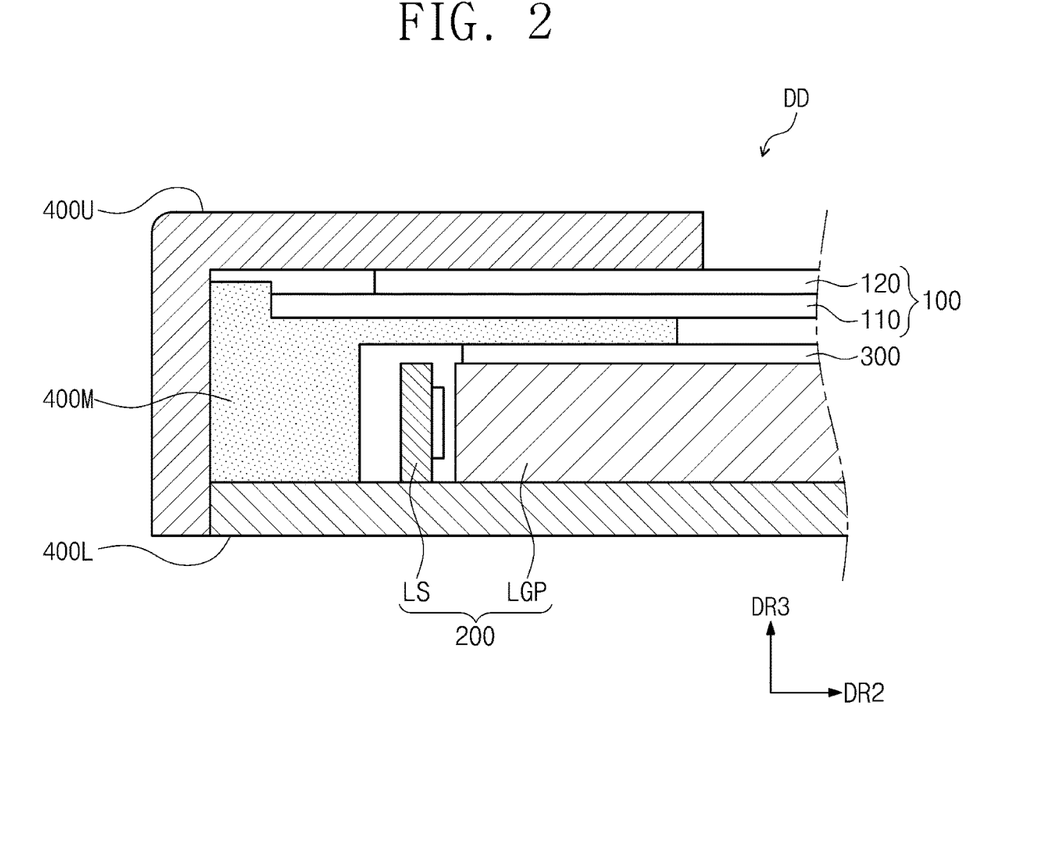
FIG. 2 is a cross-sectional view illustrating a portion of the display device according to an embodiment of the present disclosure.
Figure 3:
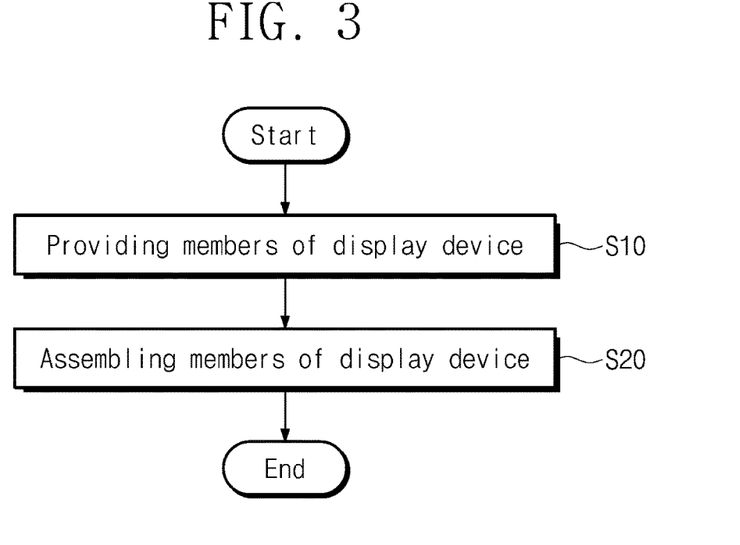
FIG. 3 is a flowchart illustrating a method for manufacturing the display device according to an embodiment of the present disclosure.

FIG. 1 is an exploded perspective view illustrating a display device DD according to an embodiment of the present disclosure. FIG. 2 is a cross-sectional view illustrating a portion of the display device DD according to an embodiment of the present disclosure. FIG. 3 is a flowchart illustrating a method for manufacturing the display device DD according to an embodiment of the present disclosure.

As illustrated in FIGS. 1 and 2, the display device DD according to an embodiment of the present disclosure includes a display panel 100, a backlight unit 200, an optical member 300, and first, second, and third protection members 400L, 400U, and 400M.

The display panel 100 in FIGS. 1 and 2 may display an image by receiving light from the backlight unit 200. Embodiments of the present disclosure are not limited to the display panel 100. In some embodiments, for example, the display panel 100 may be a transmissive or semi-transmissive display panel (such as a liquid crystal display panel, an electrophoretic display panel, and/or an electrowetting display panel).

The display panel 100 may display an image through (on) a display surface 100-IS. The display surface 100-IS may be parallel to a surface (plane) defined by a first directional axis DR1 and a second directional axis DR2. A normal direction of the display surface 100-IS (e.g., a thickness direction of the display panel 100) may align with a third directional axis DR3.

Hereinafter, a front surface (or top surface) and a rear surface (or bottom surface) of each display device element or unit are defined to be substantially normal to, and designated with respect to the third directional axis DR3. The first to third directional axes DR1, DR2, and DR3 are provided to facilitate description and illustration of the example embodiments. Hereinafter, references to the first through third directions indicate alignment with the first through third directional axes DR1, DR2, and DR3, respectively, and are designated by those reference numerals.

Although the display panel 100 is illustrated in the embodiment of FIG. 1 as being flat, in some embodiments, the display panel 100 may be a curved display panel having a curved display surface. The shape of the display panel 100 according to embodiments of the present disclosure is not particularly limited.

An example embodiment including a liquid crystal display (LCD) panel as the display panel 100 will be described. The liquid crystal display panel may include a first substrate 110, a second substrate 120 opposite the first substrate 110, and a liquid crystal layer between the first substrate 110 and the second substrate 120. The planar area of the liquid crystal display panel may be divided into a display area DA and an edge area NDA surrounding the display area DA. The display area DA is the area on which an image is displayed, and the edge area NDA is the area adjacent to the display area DA, on which an image is not displayed. The liquid crystal display panel includes a plurality of pixels in the display area DA. The LCD includes a pair of polarizers.

A signal line and a pixel circuit may be provided on one of the first substrate 110 and the second substrate 120 (hereinafter referred to as an array substrate). The array substrate may be connected to a main circuit board MPCB through a first flexible circuit board COF and/or the like. A driving chip may be further mounted to the first flexible circuit board COF. The driving chip may be a data driving circuit. A central control circuit for driving the display panel 100 may be included on the main circuit board MPCB. The central control circuit may be a microprocessor. A gate driving circuit may be mounted to the array substrate or integrated on the array substrate using any suitable low temperature poly-silicone (LTPS). The main circuit board MPCB may be connected to an external electronic component through a second flexible circuit board FPCB.

A control circuit may control the backlight unit 200. The control circuit may transmit a dimming signal that controls the backlight unit 200 to the backlight unit 200.

The backlight unit 200 is below the display panel 100 and the optical member 300. The backlight unit 200 may include a light source LS and a light guide plate LGP. The light source LS includes a plurality of light emitting elements LE and a circuit board LPCB providing an electrical signal to the light emitting elements LE. Each of the plurality of light emitting elements LE may include a light emitting diode.

The light guide plate LGP guides light received from the light source LS toward the display panel 100. In some embodiments, the light guide plate LGP may include or be made of glass. Alternatively, the light guide plate LGP may include or be made of a synthetic resin. The synthetic resin may include or be polymethyl methacrylate.

The optical member 300 is below the display panel 100 and above the backlight unit 200. The optical member 300 may include a prism sheet. In some embodiments, the optical member 300 may further include a functional sheet for improving optical characteristics.

In some embodiments, for example, the light source LS may generate blue light, and the optical member 300 may include a quantum dot sheet that receives (absorbs) the blue light to generate (provide) yellow light and/or red light. In some embodiments, the quantum dot sheet may be directly on a surface (e.g., a top surface) of the light guide plate LGP as a quantum dot layer. The quantum dot layer may be printed or applied on the top surface of the light guide plate LGP.

The protection members 400L, 400U, and 400M include a first protection member 400L below the backlight unit 200 and a second protection member 400U above the display panel 100. The protection members 400L, 400U, and 400M further include a third protection member 400M between the first protection member 400L and the second protection member 400U. The first protection member 400L, the second protection member 400U, and the third protection member 400M are coupled to each other to accommodate the display panel 100, the backlight unit 200, and the optical member 300. Each of the first protection member 400L, the second protection member 400U, and the third protection member 400M may be made of a metal and/or a plastic.

The first protection member 400L accommodates the backlight unit 200. The first protection member 400L includes a bottom portion 400L-B and a plurality of sidewall portions 400L-W that are bent and extended from an edge of the bottom portion 400L-B. Embodiments of the shape of the first protection member 400L are not particularly limited. The number of sidewall portions 400L-W may be suitably varied, and in some embodiments, one or more stepped portions may be additionally provided between the bottom portion 400L-B and the sidewall portions 400L-W.

The second protection member 400U is above the display panel 100 to cover the edge area of the display panel 100. The second protection member 400U includes an opening 400U-OP, through which a display image passes (may be shown). The opening 400U-OP may correspond to the display area DA of the display panel 100.

The third protection member 400M supports the display panel 100. The third protection member 400M may be (have the shape of) a rectangular frame on a plane. The third protection member 400M may be divided into four portions that together form the rectangular frame. The four portions may have an integrated shape (e.g., provided with each other as an integrated body), or may be assembled with each other. The four portions may define (surround) the opening 400M-OP.

Referring to FIG. 3, a method for manufacturing a display device DD includes a process S10 of providing members (e.g., components) of the display device DD and a process S20 of assembling the members of the display device DD. The members of the display device DD may include the display panel 100, the backlight unit 200, the optical member 300, and the protection members 400L, 400U, and 400M in FIGS. 1 and 2. However, when the display device DD is a light emitting type display device, the backlight unit 200 may be omitted.

The process S10 of providing the members of the display device DD includes a process (e.g., sub-processes) of transferring the display panel 100, the backlight unit 200, the optical member 300, and the protection members 400L, 400U, and 400M. The process S10 of providing the members of the display device DD may further include a process (sub-processes) of manufacturing each of the display panel 100, the backlight unit 200, the optical member 300, and the protection members 400L, 400U, and 400M. Methods of manufacturing each of the display panel 100, the backlight unit 200, the optical member 300, and the protection members 400L, 400U, and 400M may be accomplished using suitable methods.

Each of the display panel 100, the backlight unit 200, the optical member 300, and the protection members 400L, 400U, and 400M may be manufactured on different manufacturing lines, and then transferred to an assembly line. Each of the manufacturing lines and the assembly line may be in different locations. One or more of the display panel 100, the backlight unit 200, the optical member 300, and the protection members 400L, 400U, and 400M may be manufactured in outside locations separated from the assembly line, and subsequently transferred to the assembly line.

When the display panel 100, the backlight unit 200, the optical member 300, and the protection members 400L, 400U, and 400M are transferred from their manufacturing lines to the assembly line or from external manufacturing lines to the assembly line, a tray module and a tray assembly, which will be described later, may be used to safely transfer these members.

Figure 4A:
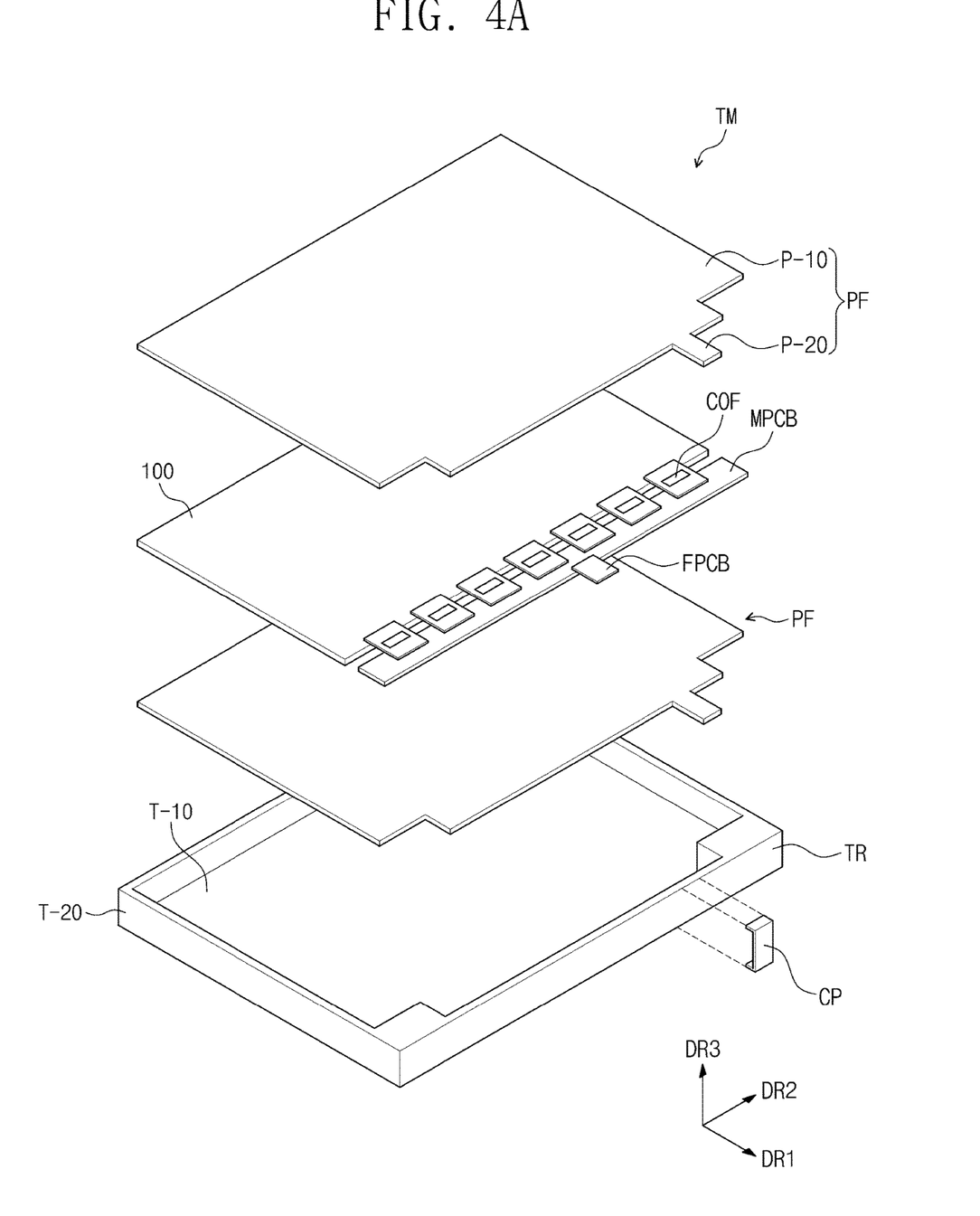
FIGS. 4A and 4B are exploded perspective views illustrating a tray module according to an embodiment of the present disclosure.
Figure 4B:
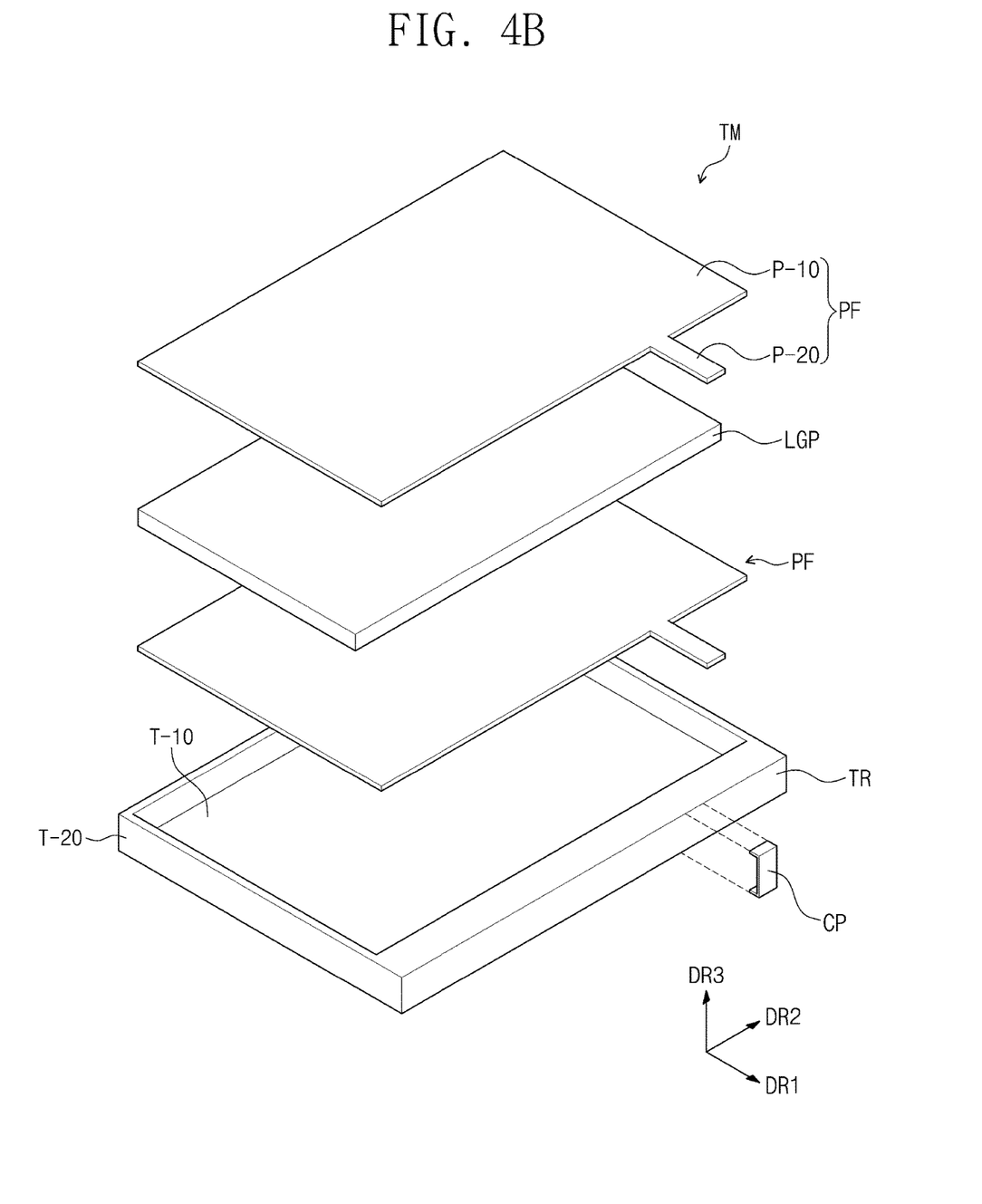
Figure 4C:
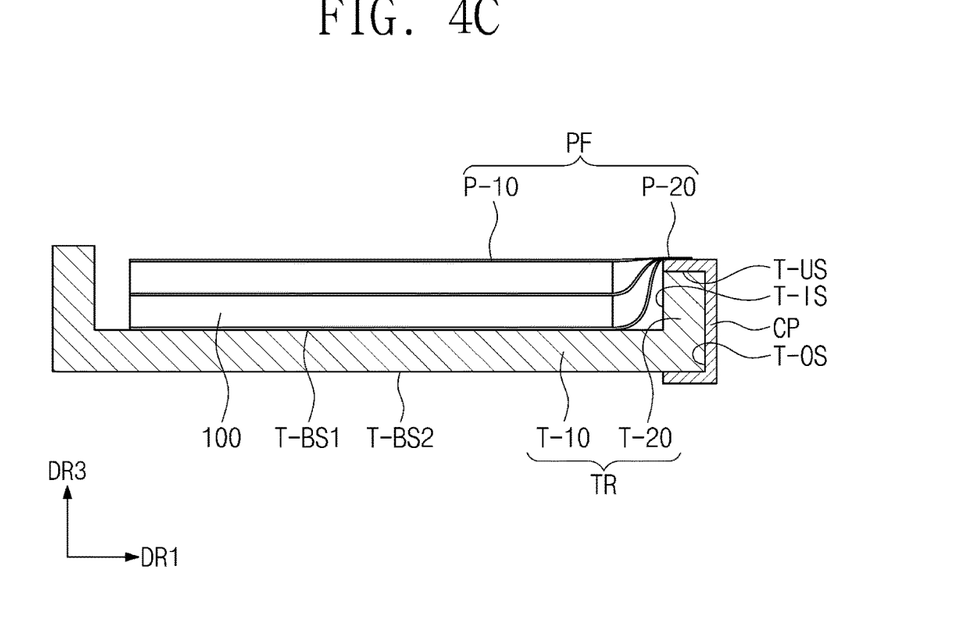
FIGS. 4C and 4D are cross-sectional views illustrating the tray module according to an embodiment of the present disclosure.
Figure 4D:
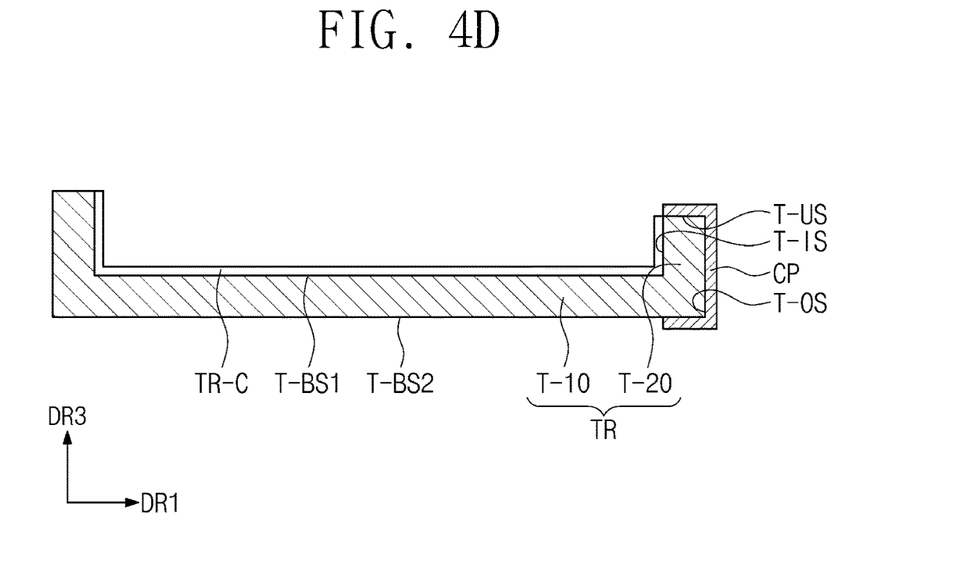

FIGS. 4A and 4B are exploded perspective views illustrating a tray module TM according to an embodiment of the present disclosure. FIGS. 4C and 4D are cross-sectional views illustrating the tray module TM according to an embodiment of the present disclosure.

As illustrated in FIGS. 4A to 4C, the tray module TM includes a tray TR, a conductive protection film PF, and a conductive pattern CP.

The tray TR accommodates at least two members of the display device. FIG. 4A illustrates one example including the display panel 100 as a first member of the display device, and FIG. 4B illustrates one example including the light guide plate LGP as a second member of the display device. The members may each include a glass substrate capable of generating static electricity. As described below, because the tray module TM has a high electrostatic discharge efficiency, the tray module TM is suitable for transferring the display panel 100 and the light guide plate LGP (e.g., without damaging the members).

The tray TR may include a bottom portion T-10 to support and overlap the display device members, and a sidewall portion T-20 extending from the bottom portion T-10. Although the bottom portion T-10 and the sidewall portion T-20 are simply illustrated in FIGS. 4A to 4C, in some embodiments, additional stepped portions may be provided between the bottom portion T-10 and the sidewall portion T-20, and additional grooves may be defined in the bottom portion T-10 and the sidewall portion T-20. The shape of the tray TR according to embodiments of the present disclosure is not limited to that illustrated in FIGS. 4A and 4B.

The tray TR may include or be made of a material such as a synthetic resin. For example, the tray TR may include or be made of expandable polystyrene. The material used to form the tray TR according to embodiments of the present disclosure is not particularly limited. The tray TR may be manufactured using any suitable plastic molding method, depending on the materials.

The conductive protection film PF may be alternatingly stacked with the members of the display device. The conductive protection film PF may reduce or protect against friction between members of the display device. Also, the conductive protection film PF may discharge static electricity that is generated on members of the display device.

The conductive protection film PF may include a protection portion P-10 to overlap and contact the members of the display device, and a connecting portion P-20 extending from the protection portion P-10 and contacting the conductive pattern CP, which will be described later. The connecting portion P-20 protrudes from the protection portion P-10, and may have a narrow width relative to the protection portion P-10 (e.g., similar to that of conductive pattern CP, which is discussed in more detail below).

Figure 4E:
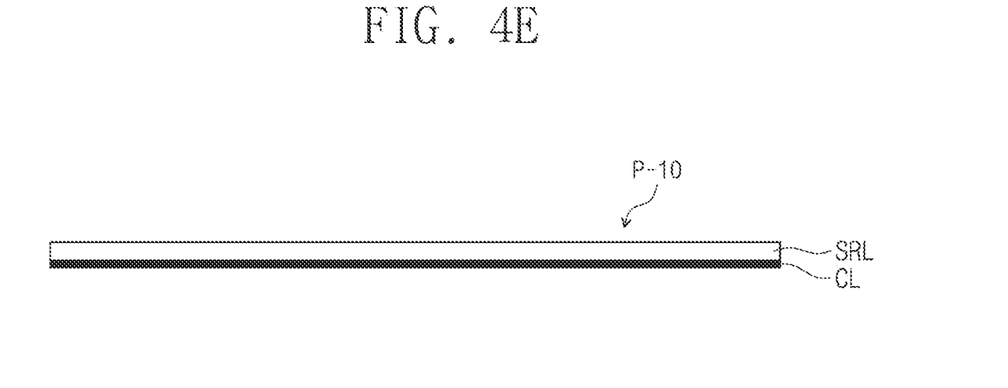
FIGS. 4E-4G are close-up views of conductive protection films, according to one or more embodiments of the present disclosure.
Figure 4F:
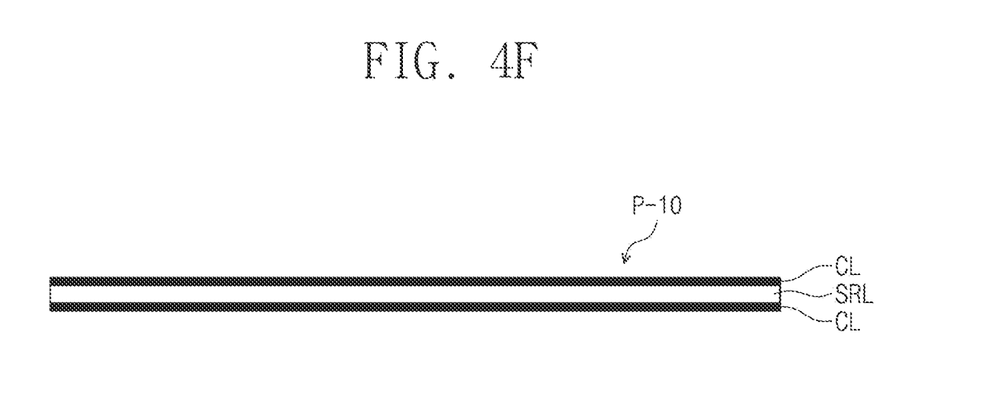
Figure 4G:
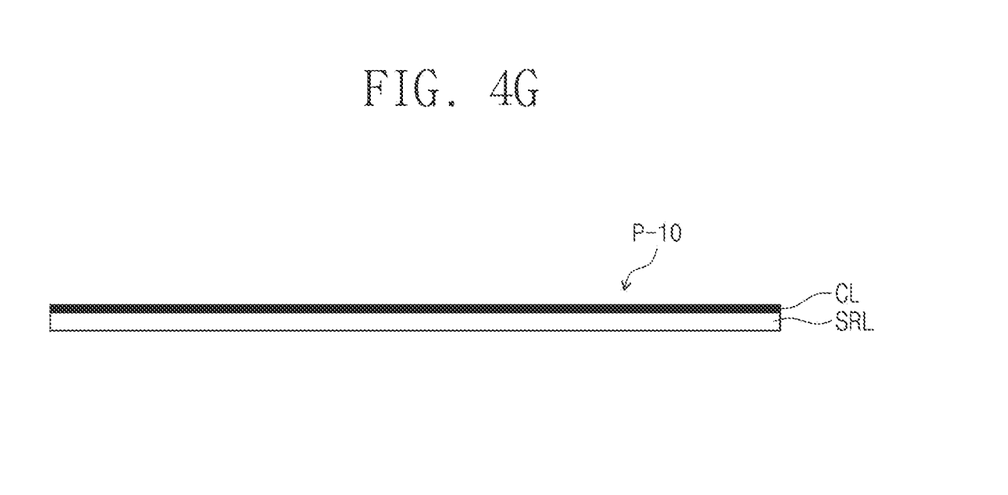

The conductive protection film PF may include a synthetic resin layer SRL and a conductive layer CL on at least one of the top and bottom surfaces of the synthetic resin layer SRL, as shown, for example, in FIGS. 4E to 4G. In some embodiments, the synthetic resin layer SRL is a porous synthetic resin layer to absorb an external impact.

The synthetic resin layer SRL may include or be formed of low density polyethylene (LDPE). The conductive layer CL may include carbon black, a conductive polymer, nano-metal, and/or a low molecular polymer. The conductive polymer may include at least one selected from polyaniline, polypyrrole, and PEDOT. The protection film PF including the conductive polymer may have a similar electrostatic discharge efficiency while being less costly than a comparative protection film PF including carbon black.

The conductive pattern CP is on the tray TR and may provide a discharge path with the conductive protection film PF. An electric charge (for example, a charge generated by static electricity) on a member of the display device in the tray TR may be transferred to the conductive protection film PF and directly or indirectly transferred to the conductive pattern CP. Finally, the electric charge may be discharged to ground through a support plate of a tray assembly that will be described later.

As illustrated in FIG. 4C, the conductive pattern CP may be on the sidewall portion T-20. At least a portion (a first portion) of the conductive pattern CP may be on a top surface T-US of the sidewall portion T-20. Another portion (a second portion) of the conductive pattern CP may be on an outer surface T-OS of the sidewall portion T-20. Still another portion (a third portion) of the conductive pattern CP may be on a bottom surface T-BS2 of the bottom portion T-10.

In some embodiments, the conductive pattern CP may include a metal layer that is printed or applied on the tray TR. The metal layer may include any conductive metal, such as aluminum (Al), gold (Au), silver (Ag), copper (Cu), and/or the like. In some embodiments, the conductive pattern CP may include a conductive tape that is attached to the tray TR. The conductive tape may include an adhesion layer and a conductive layer on the adhesion layer. The conductive tape (conductive layer) may include a resin layer and conductive particles that are mixed/dispersed in the resin layer. The conductive tape may be applied to have other suitable features.

As illustrated in FIG. 4D, in some embodiments, an additional conductive layer TR-C may be provided on an inner surface of the tray TR. The conductive layer TR-C may be on a top surface T-BS1 of the bottom portion T-10 and an inner surface T-IS of the sidewall portion T-20. The conductive layer TR-C may reduce an electrical resistance value of the tray TR to prevent or reduce generation of static electricity. The conductive layer TR-C may include carbon black, a conductive polymer, nano-metal, and/or a low molecular polymer. The conductive polymer may include at least one of polyaniline, polypyrrole, and PEDOT. The conductive layer TR-C may be applied or printed using any suitable method.

Figure 5A:
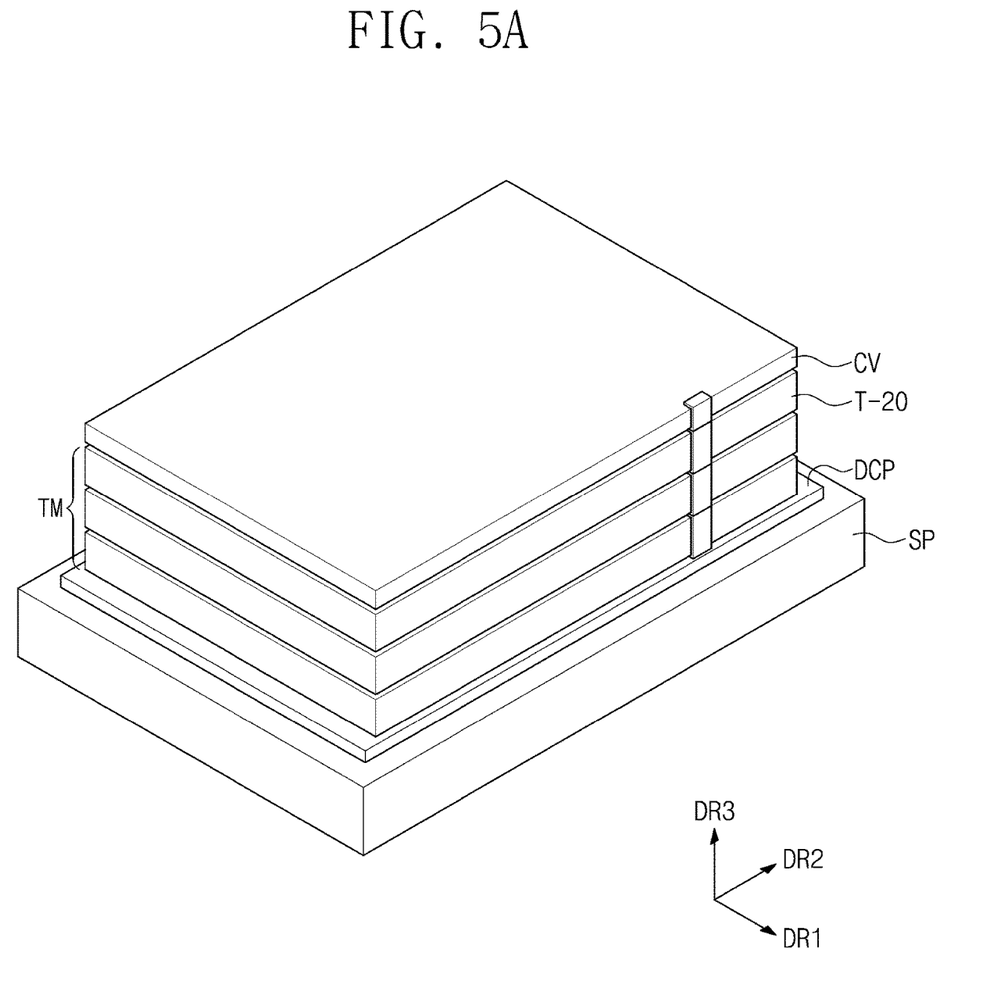
FIG. 5A is a perspective view illustrating a tray assembly according to an embodiment of the present disclosure.
Figure 5B:
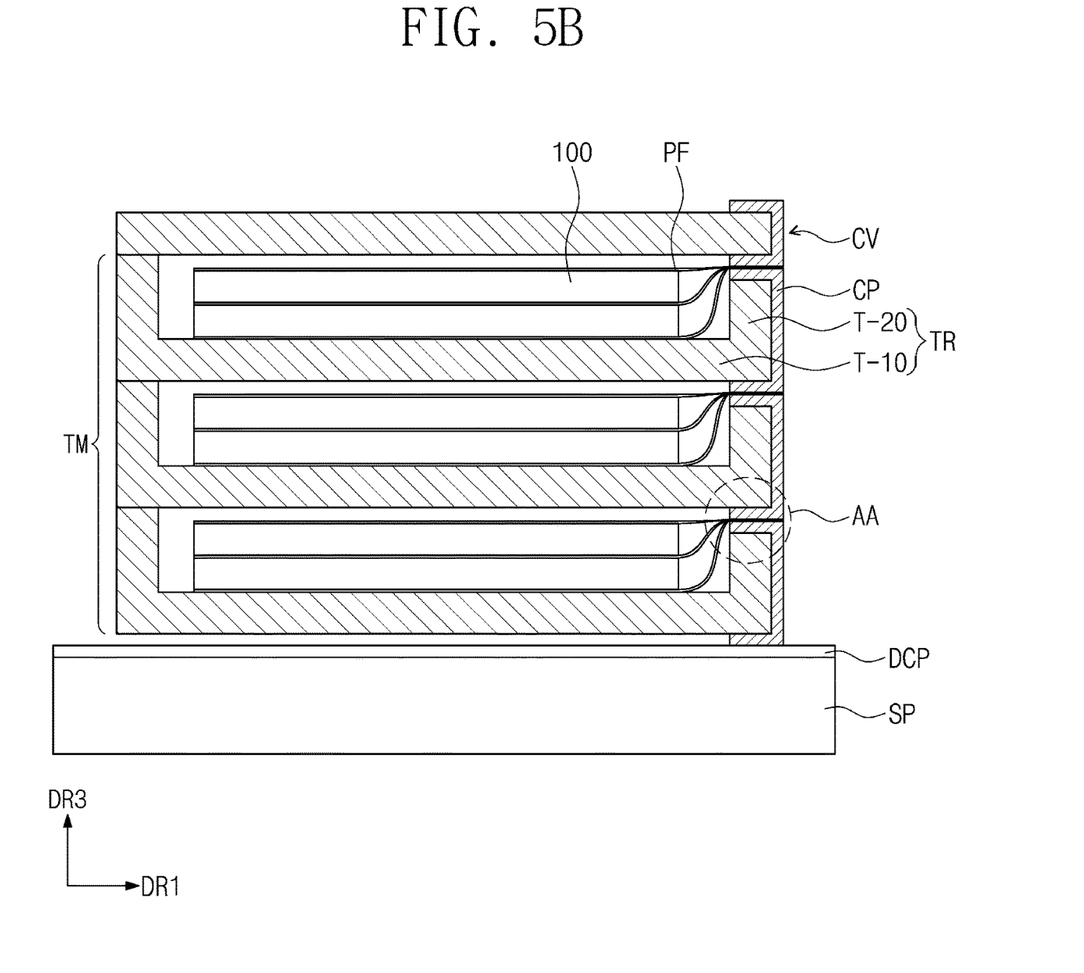
FIG. 5B is a cross-sectional view illustrating the tray assembly according to an embodiment of the present disclosure.
Figure 5C:
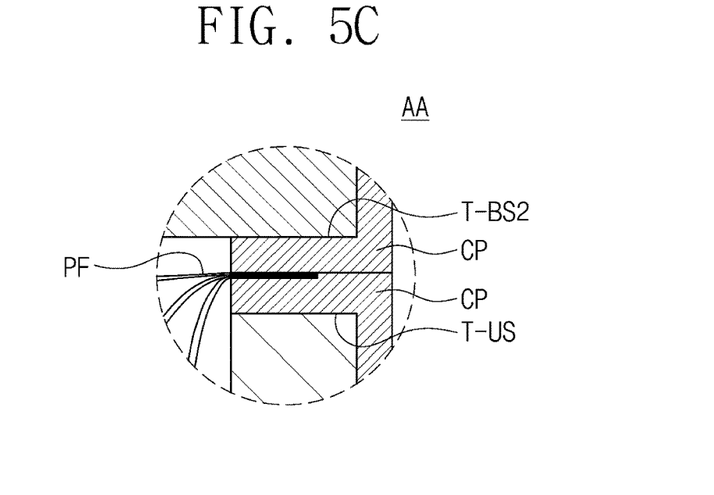
FIG. 5C is an enlarged cross-sectional view of region AA of FIG. 5B.

FIG. 5A is a perspective view illustrating a tray assembly TA according to an embodiment of the present disclosure. FIG. 5B is a cross-sectional view illustrating the tray assembly TA according to an embodiment of the present disclosure. FIG. 5C is an enlarged cross-sectional view of portion AA of FIG. 5B. Hereinafter, detailed descriptions of features of the tray module TM that were previously described with reference to FIGS. 1 to 4D will not be repeated.

The tray assembly TA includes n tray modules TM stacked with each other (where n is a natural number equal to or greater than two), and a support plate SP for supporting the n tray modules TM. Three tray modules TM are illustrated herein as an example. The tray modules TM are stacked to be aligned along their sidewall portion T-20.

The conductive patterns CP of the tray modules TM are electrically connected to each other. Here, the conductive pattern CP of an i-th tray module TM may contact the conductive pattern CP of one or both of an (i+1)-th tray module TM and an (i−1)-th tray module TM (where i is a natural number equal to or greater than one). The tray module TM contacting the support plate SP may be referred to as the first tray module, with i=1.

As illustrated in FIGS. 5B and 5C, a portion of the conductive pattern CP on the bottom surface T-BS2 of an upper tray module TM may contact a portion of the conductive pattern CP on the top surface T-US of a lower tray module TM. In some embodiments, the tray assembly TA may further include a conductive tape for connecting a portion of the conductive pattern CP on the outer surface T-OS of an upper tray module TM to a portion of the conductive pattern CP on the outer surface T-OS of a lower tray module TM.

The tray assembly TA may further include a cover CV coupled to the uppermost tray module TM (i=maximum). A conductive pattern CP may be provided on the cover CV. The conductive pattern CP of the cover CV may be electrically connected to the conductive pattern CP of the uppermost tray module TM.

The support plate SP may be made of a material including a synthetic resin and/or wood. A discharge pattern DCP that is connected to the conductive pattern CP of the lowermost tray module TM may be on a top surface of the support plate SP. The discharge pattern DCP may include carbon black, a conductive polymer, nano-metal, and/or a low molecular polymer.

An electric charge on a display device member in a tray module TM may pass through the conductive protection film PF, the conductive pattern CP, the discharge pattern DCP, and the support plate SP to then be discharged to ground. Accordingly, when a display device member is withdrawn from the tray assembly TA for assembly with other members, the conductive protection film PF may be prevented or reduced from sticking to the display device member.

Figure 6A:
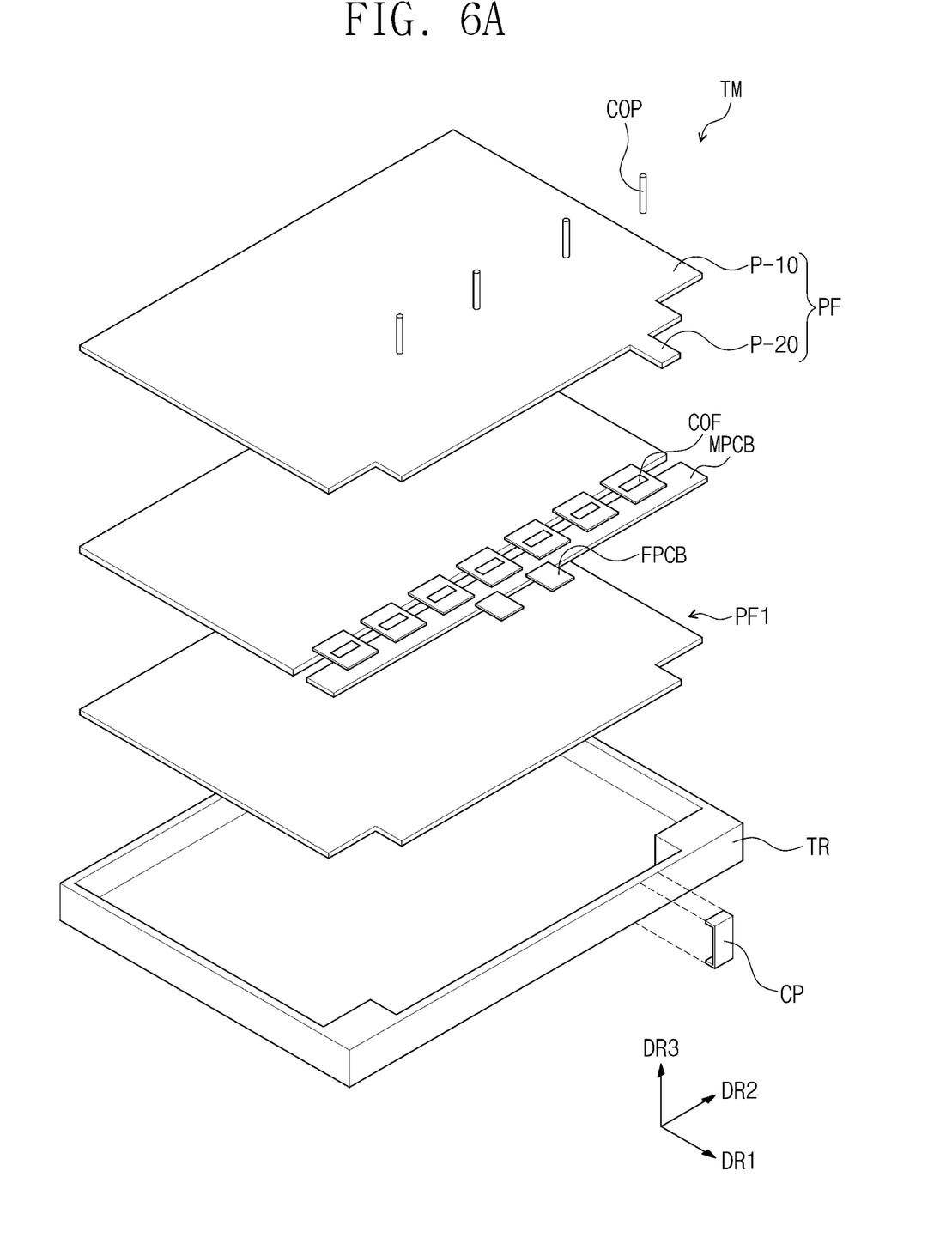
FIG. 6A is an exploded perspective view illustrating a tray module according to an embodiment of the present disclosure.
Figure 6B:
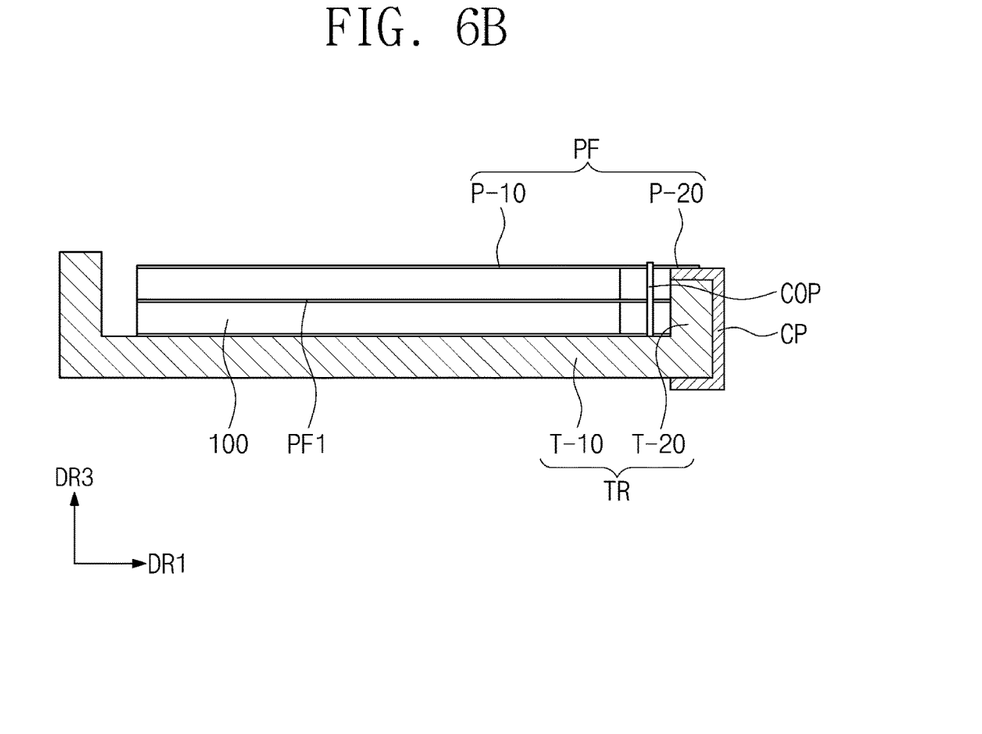
FIG. 6B is a cross-sectional view illustrating a tray assembly according to an embodiment of the present disclosure.
Figure 6C:
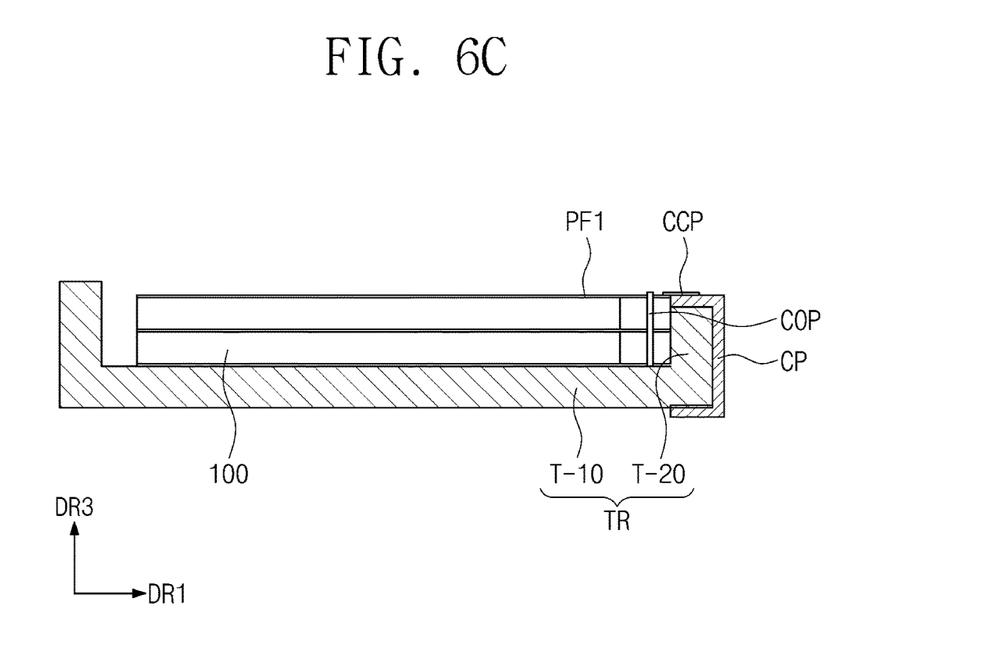
FIG. 6C is a cross-sectional view illustrating a tray assembly according to an embodiment of the present disclosure.
Figure 7:
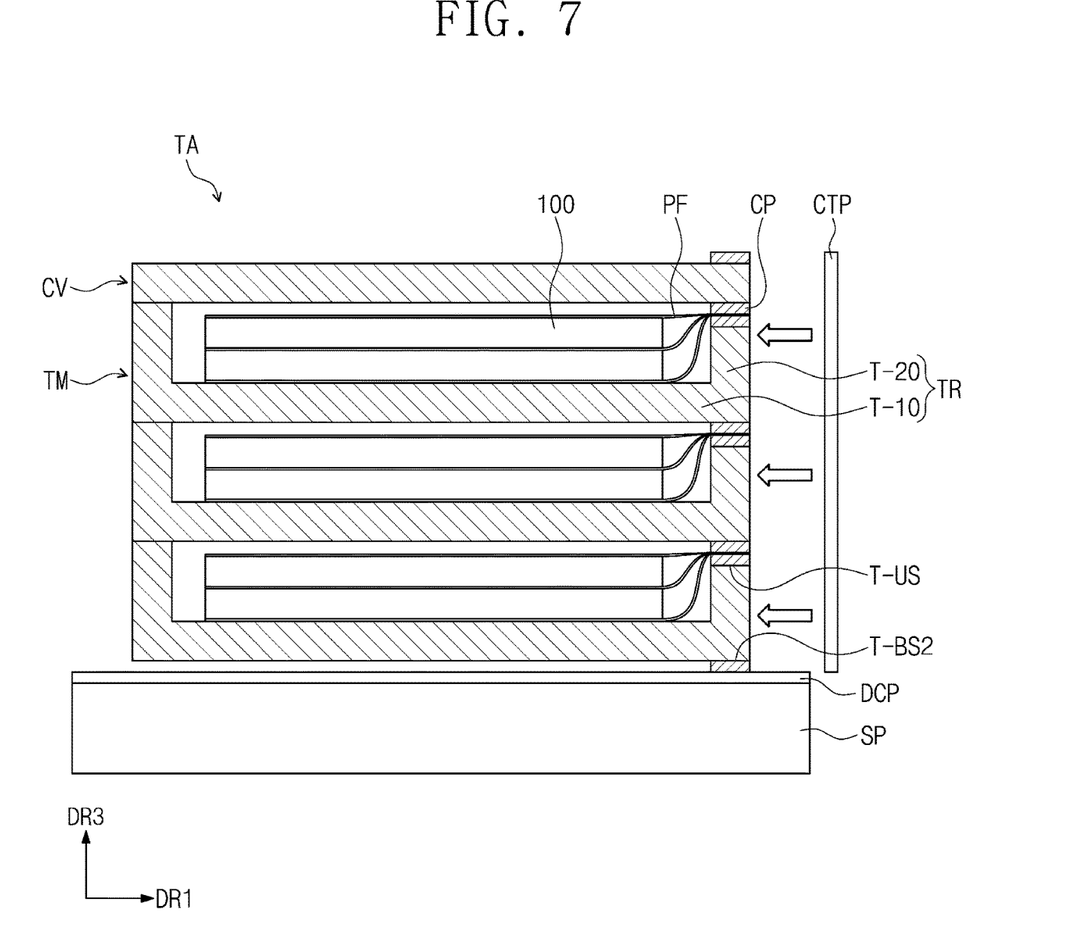
FIG. 7 is a cross-sectional view illustrating a tray assembly according to an embodiment of the present disclosure.

FIG. 6A is an exploded perspective view illustrating a tray module TM according to an embodiment of the present disclosure. FIG. 6B is a cross-sectional view illustrating the tray module TM according to an embodiment of the present disclosure. FIG. 6C is a cross-sectional view illustrating a tray module TM according to an embodiment of the present disclosure. FIG. 7 is a cross-sectional view illustrating a tray assembly TA according to an embodiment of the present disclosure. Hereinafter, detailed descriptions of features that were previously described with reference to FIGS. 1 to 5C will not be repeated.

As illustrated in FIGS. 6A to 6C, the tray module TM includes a tray TR, first and second conductive protection films PF and PF1, a conductive pattern CP, and a conductive pin COP. The conductive pin COP may provide a discharge path between the conductive protection films PF and PF1. In some embodiments, the conductive pin COP may be provided as a plurality of conductive pins. The conductive pin COP may be a metal pin. The conductive pin COP may be provided in the tray module TM in FIGS. 4A and 4B.

When the conductive pin COP is provided, each of the conductive protection films PF and PF1 besides the uppermost first conductive protection film PF at the top of the stack may not include a connecting portion P-20, as illustrated in FIG. 6B. As a distance between the conductive pattern CP of an i-th tray module TM and the conductive pattern CP of an (i+1)-th tray module TM decreases, contact reliability therebetween may increase.

In some embodiments, the uppermost second conductive protection film PF1 may also not include the connecting portion P-20, as illustrated in FIG. 6C. The tray module TM may further include a conductive connecting pattern CCP for connecting the conductive protection film PF1 to the conductive pattern CP of the tray module TM. The conductive connecting pattern CCP may be a conductive tape. Since multiple tray modules TM may be manufactured using the same type or kind of conductive protection films PF, manufacturing costs may be reduced.

The tray assembly TA in FIG. 7 may further include a conductive tape CTP for connecting (forming a connection between) the conductive patterns CP of the cover CV and each tray module TM. Although FIG. 7 illustrates an example embodiment in which the conductive pattern CP is on the top surface T-US of the sidewall portion T-20 and the bottom surface T-BS2 of the bottom portion T-10, embodiments of the present disclosure are not limited thereto. For example, the shape of the conductive pattern CP may be modified in any suitable manner.

As described above, the tray module and the tray assembly are used to transfer display device members including a glass substrate, which may generate static electricity. The electric charges (e.g., static electricity) that would accumulate on the display device members may be discharged to ground through the conductive protection films and the conductive pattern. Thus, when the display device member is withdrawn from the tray module and the tray assembly, the conductive protection film may be prevented or protected from sticking to the display device member.

As used herein, the terms "use", "using", and "used" may be considered synonymous with the terms "utilize", "utilizing", and "utilized", respectively. Further, the use of "may" when describing embodiments of the present disclosure refers to "one or more embodiments of the present disclosure".

As used herein, the terms "substantially", "about", and similar terms are used as terms of approximation and not as terms of degree, and are intended to account for the inherent deviations in measured or calculated values that would be recognized by those of ordinary skill in the art.

Also, any numerical range recited herein is intended to include all subranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

The above-disclosed subject matter is to be considered illustrative and not restrictive, and the appended claims and equivalents thereof are intended to cover all such modifications, enhancements, and other embodiments, which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A tray module comprising:
   a tray accommodating at least two members of a display device;
   at least two electrically conductive protection films alternatingly stacked with the at least two members of the display device; and
   a conductive pattern on the tray and in contact with the at least two electrically conductive protection films to provide a discharge path with the at least two electrically conductive protection films;
   wherein a first portion of the conductive pattern is located on a top surface of a sidewall portion of the tray, a second portion of the conductive pattern is located on an outer surface of the sidewall portion of the tray, and a third portion of the conductive pattern is located on a bottom surface of a bottom portion of the tray; and
   wherein each of the at least two electrically conductive protection films comprises:
     a protection portion in contact with and overlapping a corresponding member of the at least two members of the display device; and
     a connecting portion in contact with the conductive pattern and extending from the protection portion.

2. The tray module of claim 1, wherein each of the at least two electrically conductive protection films comprises:
   a synthetic resin layer comprising a top surface and a bottom surface; and
   a conductive layer on at least one of the top or the bottom surfaces of the synthetic resin layer.

3. The tray module of claim 2, wherein the conductive layer comprises a conductive polymer.

4. The tray module of claim 1, wherein the tray comprises:
   the bottom portion supporting the at least two members of the display device; and
   the sidewall portion extending from the bottom portion.

5. The tray module of claim 4, wherein the conductive pattern comprises a metal layer on the sidewall portion.

6. The tray module of claim 4, wherein the conductive pattern comprises a conductive tape on the sidewall portion.

7. The tray module of claim 1, further comprising a conductive layer on an inner surface of the tray,
   wherein the tray comprises a synthetic resin.

8. A tray assembly comprising:
   n tray modules stacked with each other, where n is a natural number greater than or equal to two; and
   a support plate configured to support the n tray modules,
   wherein each of the n tray modules comprises:
     a tray accommodating at least two members of a display device;
     at least two electrically conductive protection films alternatingly stacked with the at least two members of the display device; and
     a conductive pattern on the tray and in contact with of the at least two electrically conductive protection films to provide a discharge path with the electrically conductive protection films;
     wherein a first portion of the conductive pattern is located on a top surface of a sidewall portion of the tray, a second portion of the conductive pattern is located on an outer surface of the sidewall portion of the tray, and a third portion of the conductive pattern is located on a bottom surface of a bottom portion of the tray; and
     wherein each of the at least two electrically conductive protection films comprises:
       a protection portion in contact with and overlapping a corresponding member of the at least two members of the display device; and
       a connecting portion in contact with the conductive pattern and extending from the protection portion.

9. The tray assembly of claim 8, wherein the conductive patterns of the n tray modules are electrically connected to each other.

10. The tray assembly of claim 8, wherein the conductive pattern of an i-th tray module of the n tray modules contacts the conductive pattern of at least one of an (i+1)-th tray module or an (i−1)-th tray module, where i is a natural number equal to or greater than one.

11. The tray assembly of claim 8, further comprising a discharge pattern on the support plate and connected to the conductive pattern of a lowermost tray module of the n tray modules.

* * * * *